(12) United States Patent
Zhu et al.

(10) Patent No.: US 12,428,731 B2
(45) Date of Patent: Sep. 30, 2025

(54) FLOW GUIDE STRUCTURES AND HEAT SHIELD STRUCTURES, AND RELATED METHODS, FOR DEPOSITION UNIFORMITY AND PROCESS ADJUSTABILITY

(71) Applicant: Applied Materials, Inc., Santa Clara, CA (US)

(72) Inventors: Zuoming Zhu, Sunnyvale, CA (US); Ala Moradian, Sunnyvale, CA (US); Shu-Kwan Lau, Sunnyvale, CA (US); John Tolle, Gilbert, AZ (US); Manjunath Subbanna, Bangalore (IN); Martin Jeffrey Salinas, San Jose, CA (US); Chia Cheng Chin, Fremont, CA (US); Thomas Kirschenheiter, Tempe, AZ (US); Saurabh Chopra, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 450 days.

(21) Appl. No.: 18/085,371

(22) Filed: Dec. 20, 2022

(65) Prior Publication Data

US 2024/0018658 A1    Jan. 18, 2024

(30) Foreign Application Priority Data

Jul. 12, 2022 (GR) .............................. 20220100554
Sep. 20, 2022 (IN) .............................. 202241053769
Oct. 27, 2022 (IN) .............................. 202241061174

(51) Int. Cl.
*C23C 16/455*     (2006.01)
*C23C 16/458*     (2006.01)
(Continued)

(52) U.S. Cl.
CPC ...... *C23C 16/45591* (2013.01); *C23C 16/458* (2013.01); *C23C 16/46* (2013.01);
(Continued)

(58) Field of Classification Search
CPC ... C30B 25/14; C30B 25/10; C23C 16/45504; C23C 16/45519; C23C 16/45591; C23C 16/4585; C23C 16/45563; H01L 21/68771
See application file for complete search history.

(56) References Cited

U.S. PATENT DOCUMENTS 8,673,081 B2    3/2014    Sivaramakrishnan et al.
9,620,395 B2    4/2017    Yang et al.
(Continued)

FOREIGN PATENT DOCUMENTS

CN    111725114 A    9/2020
CN    113990780 A    1/2022
(Continued)

OTHER PUBLICATIONS

International Search Report and Written Opinion dated May 12, 2023 for Application No. PCT/US2023/010921.
(Continued)

*Primary Examiner* — Joseph A Miller, Jr.
(74) *Attorney, Agent, or Firm* — Patterson + Sheridan, LLP

(57) ABSTRACT

The present disclosure relates to flow guide structures and heat shield structures, and related methods, for deposition uniformity and process adjustability. In one implementation, an apparatus for substrate processing includes a chamber body that includes a processing volume. The apparatus includes one or more heat sources. The apparatus includes a flow guide structure positioned in the processing volume. The flow guide structure includes one or more first flow
(Continued)

dividers that divide the processing volume into a plurality of flow levels, and one or more second flow dividers oriented to intersect the one or more first flow dividers and divide each flow level of the plurality of flow levels into a plurality of flow sections. The flow guide structure includes one or more third flow dividers oriented to intersect the one or more second flow dividers and divide the plurality of flow sections into a plurality of flow zones.

22 Claims, 7 Drawing Sheets

(51) Int. Cl.
| | |
|---|---|
| *C23C 16/46* | (2006.01) |
| *C30B 25/08* | (2006.01) |
| *C30B 25/10* | (2006.01) |
| *C30B 25/12* | (2006.01) |
| *C30B 25/14* | (2006.01) |

(52) U.S. Cl.
CPC .............. *C30B 25/08* (2013.01); *C30B 25/10* (2013.01); *C30B 25/12* (2013.01); *C30B 25/14* (2013.01)

(56) References Cited

U.S. PATENT DOCUMENTS

| | | | |
|---|---|---|---|
| 9,640,416 | B2 | 5/2017 | Arai |
| 9,871,350 | B2 | 1/2018 | McLaurin et al. |
| 9,875,895 | B2 | 1/2018 | Yang et al. |
| 10,161,036 | B2 | 12/2018 | Hyon et al. |
| 10,392,702 | B2 | 8/2019 | Jung et al. |
| 10,741,396 | B2 | 8/2020 | Jung et al. |
| 10,755,955 | B2 | 8/2020 | Ishii et al. |
| 10,903,625 | B2 | 1/2021 | McLaurin et al. |
| 11,111,580 | B2 | 9/2021 | Kang et al. |
| 2002/0005400 | A1 | 1/2002 | Gat |
| 2003/0049372 | A1 | 3/2003 | Cook et al. |
| 2006/0234178 | A1 | 10/2006 | Hayashi et al. |
| 2008/0173238 | A1 | 7/2008 | Nakashima et al. |
| 2009/0165713 | A1 | 7/2009 | Kim et al. |
| 2009/0205783 | A1* | 8/2009 | Tanabe .................... C30B 29/08 118/724 |
| 2010/0068383 | A1* | 3/2010 | Kato ................. C23C 16/45546 118/728 |
| 2018/0315626 | A1 | 11/2018 | Franklin |
| 2019/0348309 | A1 | 11/2019 | Hsieh et al. |
| 2021/0028075 | A1 | 1/2021 | Zhu et al. |
| 2021/0324514 | A1 | 10/2021 | Ye et al. |
| 2022/0081775 | A1* | 3/2022 | Iriuda ............... H01L 21/67103 |
| 2022/0121196 | A1 | 4/2022 | Omori |
| 2022/0162751 | A1 | 5/2022 | Haanstra et al. |
| 2022/0170156 | A1 | 6/2022 | Jdira et al. |
| 2022/0181193 | A1 | 6/2022 | Gao et al. |
| 2022/0189804 | A1 | 6/2022 | Luan et al. |
| 2022/0199444 | A1 | 6/2022 | Oosterlaken et al. |
| 2022/0254668 | A1 | 8/2022 | Oosterlaken et al. |
| 2022/0268520 | A1 | 8/2022 | Oosterlaken et al. |
| 2022/0298643 | A1 | 9/2022 | Kajbafvala et al. |
| 2022/0298672 | A1 | 9/2022 | M'Saad et al. |
| 2022/0301829 | A1 | 9/2022 | Yoshikawa |
| 2022/0301905 | A1 | 9/2022 | Ye et al. |
| 2022/0301906 | A1 | 9/2022 | Naik et al. |
| 2022/0352006 | A1 | 11/2022 | Huang et al. |
| 2022/0359246 | A1 | 11/2022 | Umeoka |

FOREIGN PATENT DOCUMENTS

| | | |
|---|---|---|
| CN | 111893567 B | 2/2022 |
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 216357351 U | 4/2022 |
| CN | 110854044 B | 5/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| JP | 2003168650 A | 6/2003 |
| WO | 2009109896 A1 | 9/2009 |
| WO | 2022031406 A1 | 2/2022 |
| WO | 2022031422 A1 | 2/2022 |

OTHER PUBLICATIONS

International Search Report and Written Opinion dated Jul. 31, 2023 for Application No. PCT/US2023/018182.

* cited by examiner

FLOW GUIDE STRUCTURES AND HEAT SHIELD STRUCTURES, AND RELATED METHODS, FOR DEPOSITION UNIFORMITY AND PROCESS ADJUSTABILITY

CROSS-REFERENCE TO RELATED APPLICATIONS

This application claims priority to Greece provisional patent application serial number 20220100554, filed Jul. 12, 2022, claims priority to India provisional patent application serial number 202241053769, filed Sep. 20, 2022, and claims priority to India provisional patent application serial number 202241061174, filed Oct. 27, 2022, all of which are herein incorporated by reference in their entireties.

BACKGROUND

Field

The present disclosure relates to flow guide structures and heat shield structures, and related methods, for deposition uniformity and process adjustability.

Description of the Related Art

Semiconductor substrates are processed for a wide variety of applications, including the fabrication of integrated devices and microdevices. However, operations (such as epitaxial deposition operations) can be long, expensive, and inefficient, and can have limited capacity and throughput. Operations can also be limited with respect to film growth rates. Moreover, hardware can involve relatively large dimensions that occupy higher footprints in manufacturing facilities. Additionally, operations can involve hindrances with temperature control, gas control, and/or substrate center-to-edge control and adjustability. Such hindrances can be exacerbated in relatively complex processing operations. For example, deposition non-uniformity and process adjustability can be hindered in batch epitaxial processing.

Therefore, a need exists for improved apparatuses and methods in semiconductor processing.

SUMMARY

The present disclosure relates to flow guide structures and heat shield structures, and related methods, for deposition uniformity and process adjustability.

In one implementation, an apparatus for substrate processing includes a chamber body that includes a processing volume, a plurality of gas inject passages formed in the chamber body, and one or more gas exhaust passages formed in the chamber body. The apparatus includes one or more heat sources configured to generate heat, and a substrate support assembly positioned in the processing volume. The apparatus includes a flow guide structure positioned in the processing volume. The flow guide structure includes one or more first flow dividers that divide the processing volume into a plurality of flow levels, and one or more second flow dividers oriented to intersect the one or more first flow dividers and divide each flow level of the plurality of flow levels into a plurality of flow sections. The flow guide structure includes one or more third flow dividers oriented to intersect the one or more second flow dividers and divide the plurality of flow sections into a plurality of flow zones.

In one implementation, an apparatus for substrate processing includes a chamber body that includes one or more sidewalls, a processing volume, a plurality of gas inject passages formed in the chamber body, and one or more gas exhaust passages formed in the chamber body. The apparatus includes a substrate support assembly positioned in the processing volume, and one or more liners configured to line the one or more sidewalls of the chamber body. The one or more liners include a plurality of liner gaps. The apparatus includes a flow guide structure positioned in the processing volume, the flow guide structure includes one or more first flow dividers that divide the processing volume into a plurality of flow levels. The one or more first flow dividers are coupled to the one or more liners. The flow guide structure includes one or more second flow dividers oriented to intersect the one or more first flow dividers and divide each flow level of the plurality of flow levels into a plurality of flow sections. The flow guide structure includes a plurality of third flow dividers oriented to intersect the one or more second flow dividers and divide the plurality of flow sections into a plurality of flow zones, and a plurality of flow gaps between the plurality of third flow dividers. The plurality of flow gaps are aligned with the plurality of liner gaps. The apparatus includes a plurality of windows positioned in the plurality of liner gaps.

In one implementation, a flow guide structure for positioning in substrate processing chambers includes one or more first flow dividers that divide a volume into a plurality of flow levels. The flow guide structure includes one or more second flow dividers oriented to intersect the one or more first flow dividers and divide each flow level of the plurality of flow levels into a plurality of flow sections. The flow guide structure includes one or more third flow dividers oriented to intersect the one or more second flow dividers and divide the plurality of flow sections into a plurality of flow zones that have an angular size. The plurality of flow zones define a plurality of inner voids for each flow section of the plurality of flow sections

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to flow guide structures and heat shield structures, and related methods, for deposition uniformity and process adjustability.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links.

Figure 1:
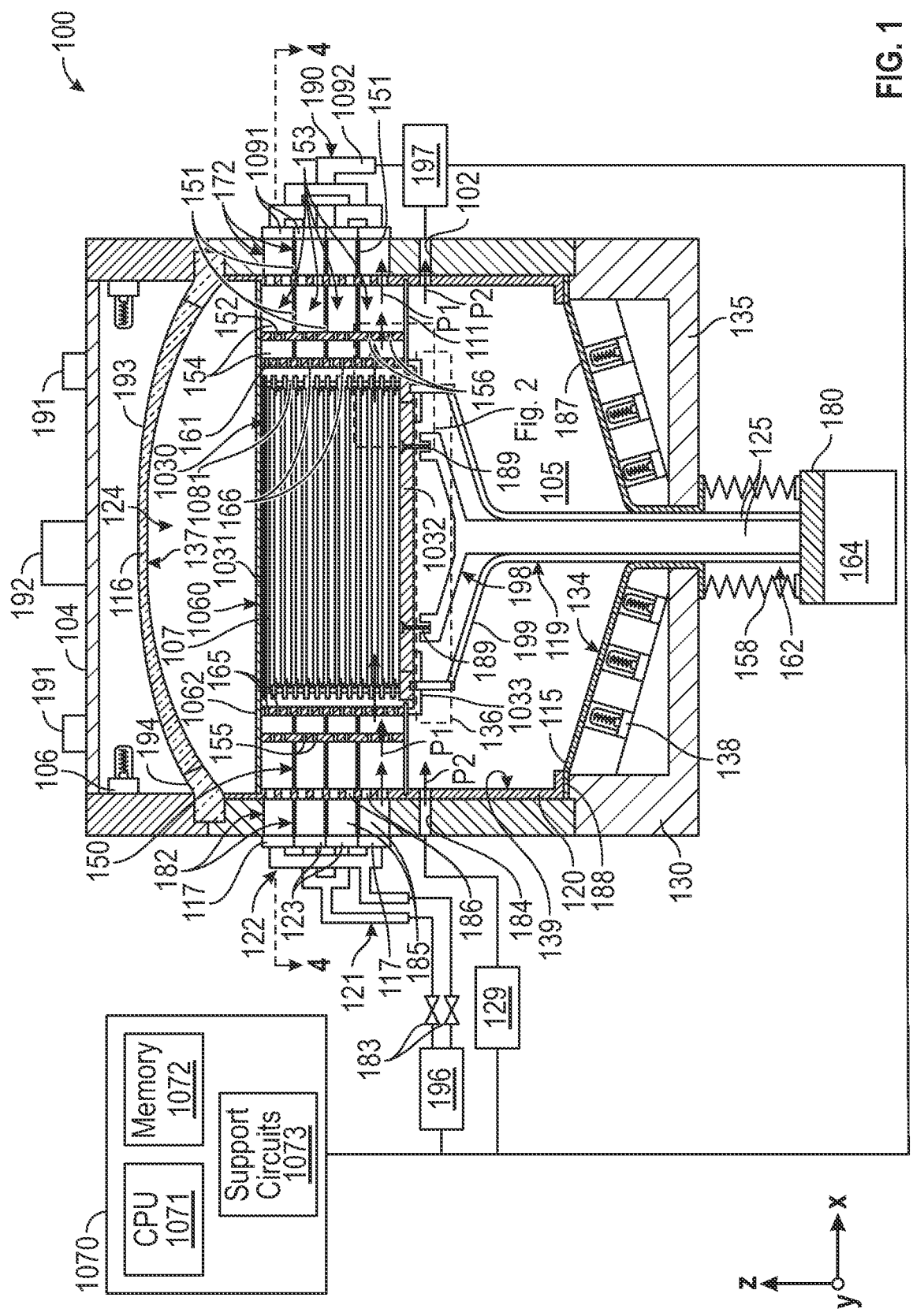
FIG. 1 is a schematic cross-sectional side view of a processing apparatus, along Section 1-1 shown in FIG. 4, according to one implementation.
Figure 3:
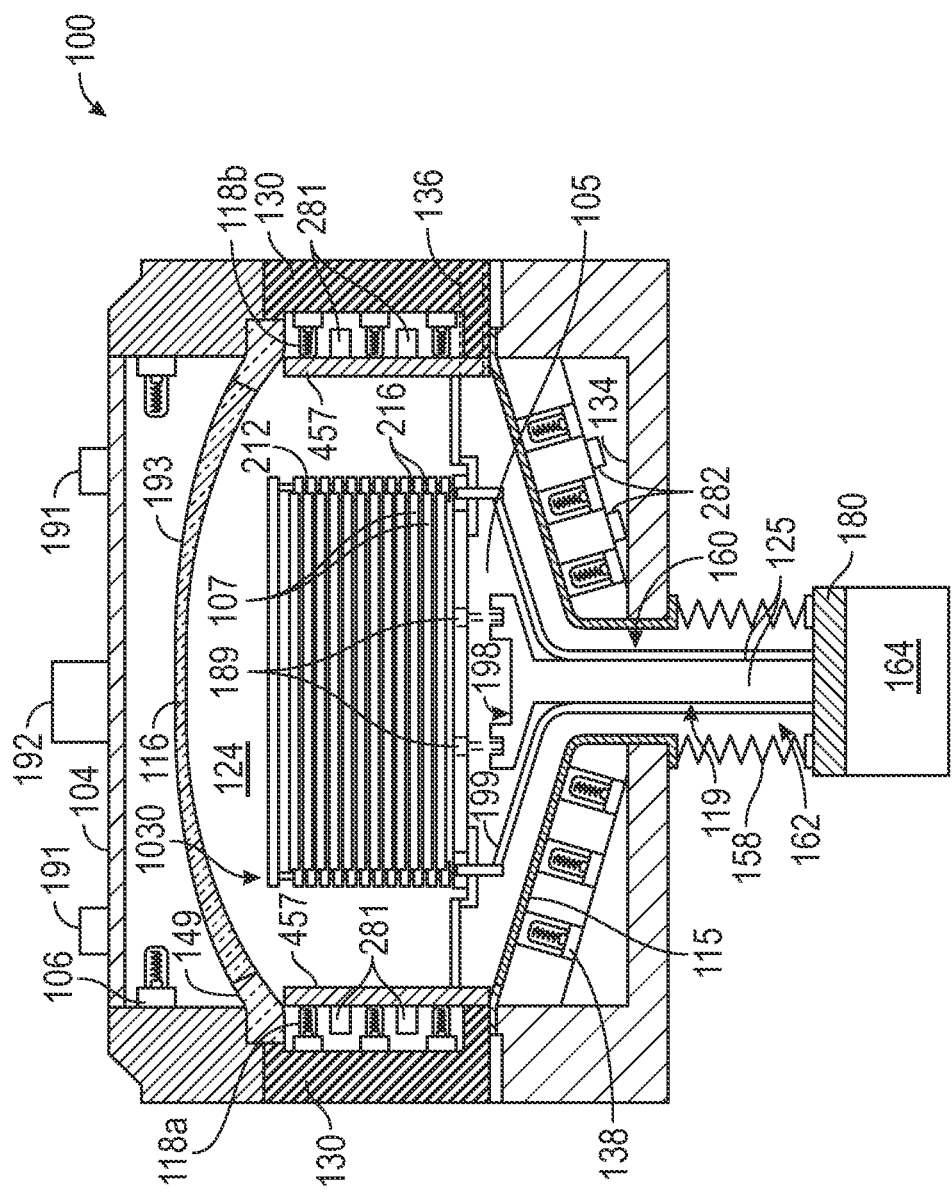
FIG. 3 is a schematic cross-sectional side view of the processing apparatus shown in FIG. 1, along Section 3-3 shown in FIG. 4, according to one implementation.
Figure 4:
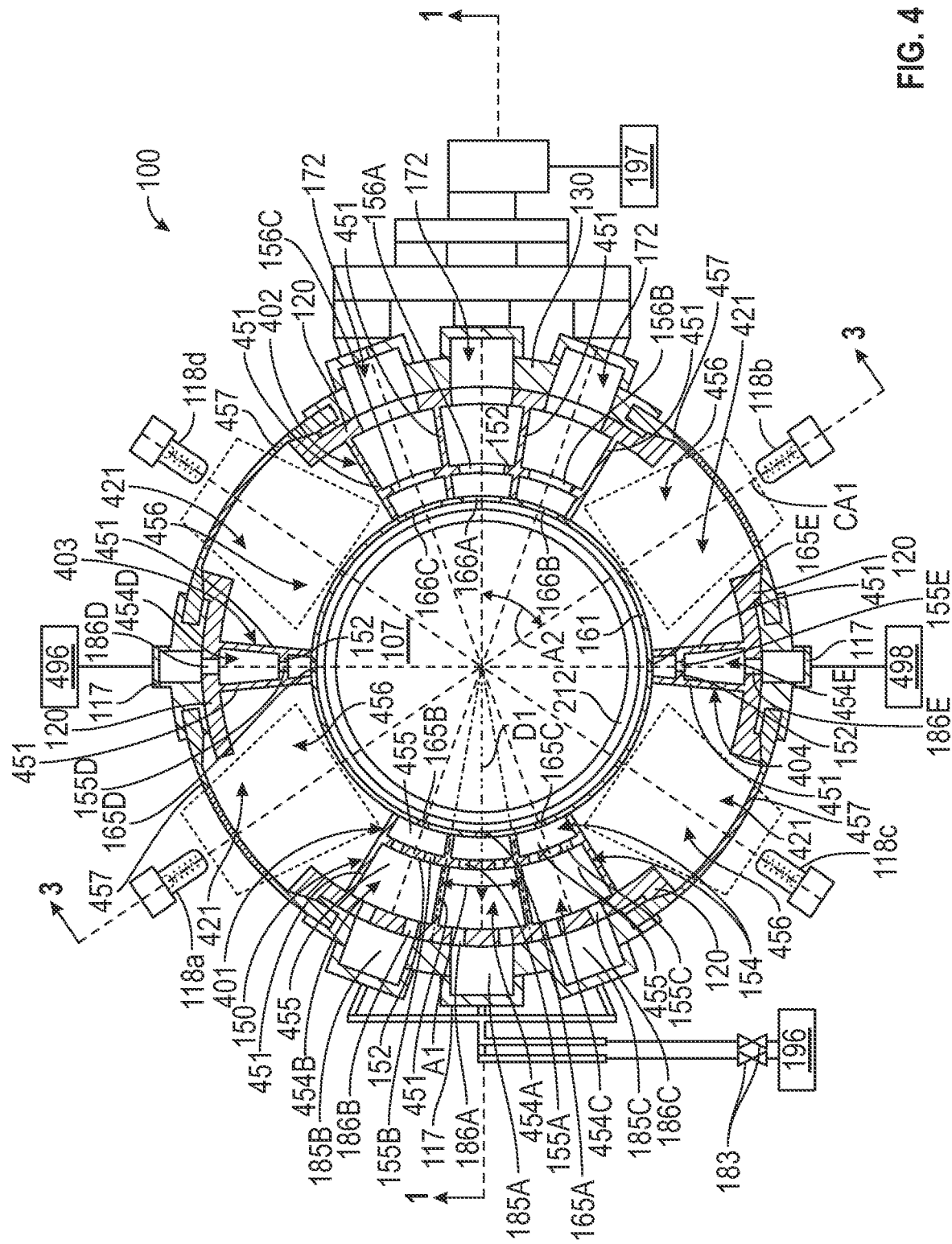
FIG. 4 is a schematic top cross-sectional view, along Section 4-4 shown in FIG. 1, of the processing apparatus shown in FIGS. 1-3, according to one implementation.

FIG. 1 is a schematic cross-sectional side view of a processing apparatus 100, along Section 1-1 shown in FIG. 4, according to one implementation. The side heat sources 118a, 118b shown in FIG. 3 are not shown in FIG. 1 for visual clarity purposes. The processing apparatus 100 includes a processing chamber having a chamber body 130 that defines a processing volume 124.

A cassette 1030 is positioned in the processing volume 124 and at least partially supported by a substrate support assembly 119 (such as a pedestal assembly). The cassette 1030 is positioned inwardly of the first shield plate 161. The cassette 1030 includes a first cassette plate 1032, a second cassette plate 1031 spaced from the first cassette plate 1032, and a plurality of levels that support a plurality of substrates 107 for simultaneous processing (e.g., epitaxial deposition). In the implementation shown in FIG. 1, the cassette 1030 supports twelve substrates 107. The cassette 1030 can support other numbers of substrates, including but not limited to two substrates 107, three substrates 107, six substrates 107, or eight substrates 107.

The processing apparatus 100 includes an upper window 116, such as a dome, disposed between a lid 104 and the processing volume 124. The processing apparatus 100 includes a lower window 115 disposed below the processing volume 124. One or more upper heat sources 106 are positioned above the processing volume 124 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 107. One or more lower heat sources 138 are positioned below the processing volume 124 and the lower window 115. The one or more lower heat sources 138 can be radiant heat sources such as lamps, for example halogen lamps. The lower heat sources 138 are disposed between the lower window 115 and a floor 134 of the processing volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 95% of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window that partially defines the processing volume 124. The outer window supports 194 support the inner window 193 and are at least partially disposed within a support groove. In one or more embodiments, the lower window 115 includes an inner window 187 and outer window supports 188. The inner window 187 may be a thin quartz window that partially defines the processing volume 124. The outer window supports 188 support the inner window 187.

The substrate support assembly 119 is disposed in the processing volume 124. One or more liners 120 are disposed in the processing volume 124 and surround the substrate support assembly 119. The one or more liners 120 facilitate shielding the chamber body 130 from processing chemistry in the processing volume 124. The chamber body 130 is disposed at least partially between the upper window 116 and the lower window 115. The one or more liners 120 are disposed between the processing volume 124 and the chamber body 130.

The processing apparatus 100 includes a plurality of gas inject passages 182 formed in the chamber body 130 and in fluid communication with the processing volume 124, and one or more gas exhaust passages 172 (a plurality is shown in FIG. 1) formed in the chamber body 130 opposite the plurality of gas inject passages 182. The one or more gas exhaust passages 172 are in fluid communication with the processing volume 124. Each of the plurality of gas inject passages 182 and one or more gas exhaust passages 172 are formed through one or more sidewalls of the chamber body 130 and through one or more liners 120 that line the one or more sidewalls of the chamber body 130.

Each gas inject passage 182 includes a gas channel 185 formed in the chamber body 130 and one or more gas openings 186 (two and three are shown in FIG. 1) formed in the one or more liners 120. One or more supply conduit systems are in fluid communication with the gas inject passages 182. In FIG. 1, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing apparatus 100 includes a flow guide structure 150 positioned in the processing volume 124. The flow guide structure 150 includes one or more first flow dividers 151 (three are shown in FIG. 1) that divide the processing volume into a plurality of flow levels 153 (four flow levels are shown in FIG. 1). In one or more embodiments, the flow guide structure 150 includes at least three flow levels 153. The flow guide structure 150 includes one or more second flow dividers 152 oriented to intersect the one or more first flow dividers 151 and divide each flow level 153 of the plurality of flow levels 153 into a plurality of flow sections 154 (two flow sections 154 are shown for each flow level 153 in FIG. 1). In the implementation shown in FIG. 1, the first flow dividers 151 each include a ring, and the one or more second flow dividers 152 each include a cylindrical sleeve that surrounds an innermost flow section 154 of the flow sections 154. The one or more first flow dividers 151 are coupled to the one or more liners 120.

The plurality of gas inject passages are 182 positioned as a plurality of inject levels such that each gas inject passage 182 corresponds to one of the plurality of inject levels. Each inject level aligns with a respective flow level 153. The gas inject passages 182 of each inject level are open to an outermost flow section 154 of the respective flow level (through the gas openings 186). In the implementation shown in FIG. 1, two or three of the gas openings 186 are grouped into each flow level, and the gas openings 186 are open to the outermost flow section 154 of the respective flow level.

The processing apparatus 100 includes a heat shield structure 1060 positioned in the processing volume 124. The heat shield structure 1060 includes a first shield plate 161 positioned inwardly of the one or more second flow dividers 152, and a second shield plate 1062. The second shield plate 1062 is oriented to intersect the first shield plate 161 and is supported at least partially by the one or more liners 120. The first shield plate 161 can be a cylindrical sleeve.

Each of the one or more second flow dividers 152 includes a plurality of divider inlet openings 155 and a plurality of divider outlet openings 156 formed therein. The divider outlet openings 156 are opposite of the divider inlet openings 155. As shown in FIG. 1, two or three of the divider inlet openings 155 and two or three of the divider outlet openings 156 are grouped into a respective flow level 153 of the flow levels 153.

The first shield plate 161 includes a plurality of shield inlet openings 165 and a plurality of shield outlet openings 166 formed therein. The shield outlet openings 166 are opposite of the shield inlet openings 165. The plurality of divider inlet openings 155 are offset from the plurality of shield inlet openings 165 in the X-Y plane.

Each of the one or more liners 120, the one or more first flow dividers 151, the one or more second flow dividers 152, the one or more third flow dividers 451, the first shield plate 161, and the second shield plate 1062 is formed of one or more of quartz (such as transparent quartz, e.g. clear quartz, or opaque quartz, e.g. black quartz), silicon carbide (SiC), or graphite coated with SiC.

The cassette 1030 is positioned inwardly of the first shield plate 161. A pre-heat ring 111 is positioned outwardly of the cassette 1030. The pre-heat ring 111 is coupled to and/or at least partially supported by the one or more liners 120. The one or more second flow dividers 152 are coupled to and/or at least partially supported by the pre-heat ring 111.

Portions of the flow guide structure 150 (such as the first flow dividers 151) may act as a pre-heat ring for all flow sections 154 of each flow level 153. The pre-heat ring 111 may be part of (such as integrated with) the flow guide structure 150. The present disclosure contemplates that the pre-heat ring 111 can be one of the first flow dividers 151.

During operations (such as during an epitaxial deposition operation), one or more process gases P1 are supplied to the processing volume 124 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passage 182 is configured to direct the one or more processing gases P1 in a generally radially inward direction towards the cassette 1030. As such, in one or more embodiments, the gas inject passages 182 may be part of a cross-flow gas injector. The flow(s) of the one or more process gases P1 are divided into the plurality of flow levels 153. The division of process gas(es) into the plurality of flow levels 153 facilitates uniform processing (e.g., deposition) onto the substrates, center-to-edge uniformity, and process adjustability.

The processing apparatus 100 includes an exhaust conduit system 190. The one or more process gases P1 can be exhausted through exhaust gas openings formed in the one or more liners 120, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases can include, for example, one or more of argon (Ar), helium (He), nitrogen ($N_2$), hydrogen chloride (HCl), and/or hydrogen ($H_2$).

Purge gas P2 supplied from a purge gas source 129 is introduced to the bottom region 105 of the processing volume 124 through one or more purge gas inlets 184 formed in the sidewall of the chamber body 130.

The one or more purge gas inlets 184 are disposed at an elevation below the gas inject passages 182. If the one or more liners 120 are used, a section of the one or more liners 120 may be disposed between the gas inject passages 182 and the one or more purge gas inlets 184. In either case, the one or more purge gas inlets 184 are configured to direct the purge gas P2 in a generally radially inward direction. The one or more purge gas inlets 184 may be configured to direct the purge gas P2 in an upward direction. During a film formation process, the substrate support assembly 119 is located at a position that can facilitate the purge gas P2 to flow generally along a flow path across a back side of the cassette 1030. The purge gas P2 exits the bottom region 105 and is exhausted out of the processing apparatus 100 through one or more purge gas exhaust passages 102 located on the opposite side of the processing volume 124 relative to the one or more purge gas inlets 184.

The substrate support assembly 119 includes a first support frame 198 and a second support frame 199 disposed at least partially about the first support frame 198. The second support frame 199 includes arms coupled to the cassette 1030 such that lifting and lowering the second support frame 199 lifts and lowers the cassette 1030. A plurality of lift pins 189 are suspended from the cassette 1030. Lowering of the cassette 1030 initiates contact of the lift pins 189 with arms of the first support frame 198. Continued lowering of the cassette 1030 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030. A stem 125 of each support frame 198, 199 extends through a bottom 135 of the chamber body 130 and the floor 134. The stems 125 are coupled to a respective motor 164, which is configured to independently raise, lower, and/or rotate the cassette 1030 using the second support frame 199, and to independently raise and lower the lift pins 189 using the first support frame 198.

A pedestal bellows port 160 is formed in the floor 134 and the bottom 135 of the chamber body 130. The pedestal bellows ports 160 extends through the bottom 135 of the chamber body 130. The pedestal bellows port 160 has a diameter larger than a diameter of the stem 125 and circumscribes each stem 125 where the stem 125 extends through the bottom 135 of the chamber body 130. The pedestal bellows port 160 circumferentially surround the stems 125. A bellows assembly 158 is disposed around each pedestal bellows port 160 to facilitate reduced or eliminated vacuum leakage outside the chamber body 130. Each of the bellows assemblies 158 circumscribe and enclose a portion of the stems 125 disposed outside the chamber body 130. The bellows assemblies 158 are coupled between an exterior surface of the bottom 135 of the chamber body 130 and a base member 180. The base member 180 may house the motor 164 and a portion of the stem 125, which is coupled to the motor 164. The bellows assembly 158 may be formed from a metallic or metallized material and be configured to form a gas flow channel 162. The gas flow channel 162 is defined as a region between the outer stem 125 and the bellows assembly 158. The gas flow channel 162 extends from the pedestal bellows port 160 to the base member 180. As such, the gas flow channel 162 forms a hollow cylindrically shaped passage between the bellows assembly 158 and the stem 125. The gas flow channel 162 is fluidly coupled between the bottom region 105 and an exhaust conduit, which may be used to pump (e.g., exhaust) gases from the bottom region 105 through the pedestal bellows port 160.

An opening 136 (a substrate transfer opening) is formed through the one or more sidewalls of the chamber body 130. The opening 136 may be used to transfer the substrates 107 to or from the cassette 1030, e.g., in and out of the processing volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 3 for visual clarity purposes.

The processing apparatus 100 may include one or more temperature sensors 191, 192, 282, such as optical pyrometers, which measure temperatures within the processing apparatus 100 (such as on the surfaces of the upper window 116, and/or one or more surfaces of the substrates 107, the heat shield structure 1060, and/or the cassette 1030). The one or more temperature sensors 191, 192 are disposed on the lid 104. The one or more temperature sensors 282 (e.g., lower pyrometers) are disposed on a lower side of the lower window 115. The one or more temperature sensors 282 can be disposed adjacent to and/or on the bottom 135 of the chamber body 130.

In one or more embodiments, upper temperature sensors 191, 192 are oriented toward a top of the cassette 1030 (such as an upper surface of the second cassette plate 1031. In one or more embodiments, side temperature sensors 281 are oriented toward the first shield plate 161 and/or substrate supports 212 of the cassette 1030. In one or more embodiments, lower temperature sensors 282 are oriented toward a bottom of the cassette 1030 (such as a lower surface of the first cassette plate 1032.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 700) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 700) and operations (such as the operations 702-712) described herein to be conducted. The controller 1070 can be in communication with the heat sources, the gas sources, and/or the vacuum pump(s) of the processing apparatus 100, for example, to cause a plurality of operations to be conducted.

Figure 2:
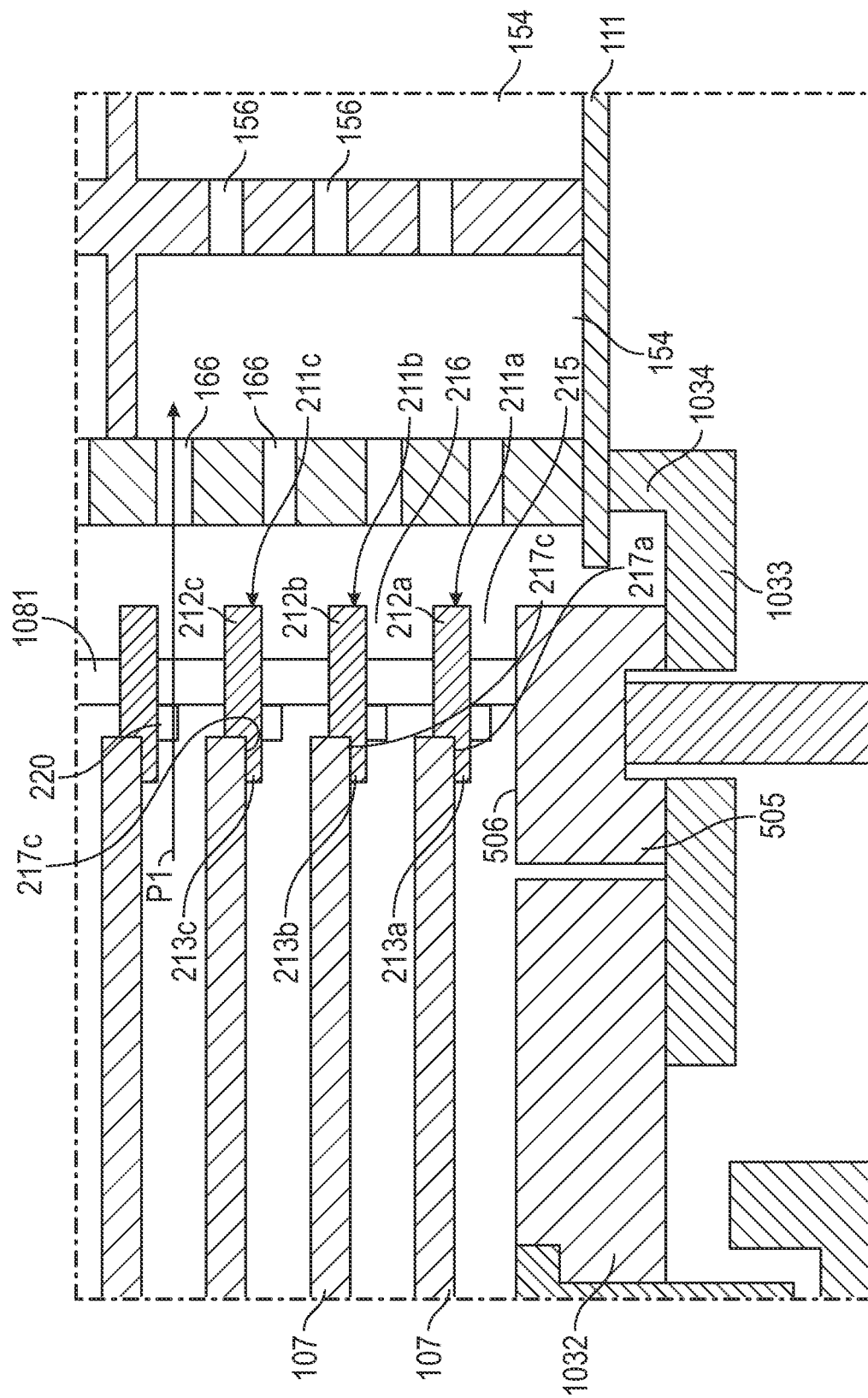
FIG. 2 is an enlarged view of the schematic cross-sectional side view of the processing apparatus shown in FIG. 1, according to one implementation.

FIG. 2 is an enlarged view of the schematic cross-sectional side view of the processing apparatus 100 shown in FIG. 1, according to one implementation.

The cassette 1030 includes a plurality of levels 211 positioned between the first cassette plate 1032 and the second cassette plate 1031.

Each level 211 includes an arcuate support 212 having one or more inner ledges 213 that support a substrate 107. A section of the cassette 1030 is shown in FIG. 2. The cassette 1030 includes a first level 211a that includes a first arcuate support 212a having a first inner ledge 213a, and a second level 211b that includes a second arcuate support 212b having a second inner ledge 213b. The first arcuate support 212a and the second arcuate support 212b are positioned between the first cassette plate 1032 and the second cassette plate 1031.

The cassette 1030 includes a first opening 215 on an outer side of the first arcuate support 212a, a second opening 216 between the first arcuate support 212a and the second arcuate support 212b. Each inner ledge 213a-213c includes a support surface 217a-217c.

Each of the shield inlet openings 165 and each of the shield outlet openings 166 is aligned between two respective arcuate supports 212 (as shown for the shield outlet openings 166 in FIG. 2). The positions of the shield inlet openings 165 and the shield outlet openings 166 facilitate separately providing the one or more process gases P1 to gaps between adjacent substrates 107, which facilitates processing uniformity and processing adjustability.

The cassette 1030 includes a plurality of mount columns 1081 extending through the arcuate supports 212 (including the first arcuate support 212a, the second arcuate support 212b, and a third arcuate support 212c).

Each mount column 1081 of the plurality of mount columns 1081 includes ledge interfaces between the respective mount column and the arcuate supports 212. In one or more embodiments, ledges 220 can extend outwardly relative to the mount columns 1081. In one or more embodiments, ledges can extend inwardly relative to inner faces of the arcuate supports 212, such as into grooves formed in outer faces of the mount columns 1081. The ledges 220 can include, for example, one or more pins or one or more arcuate ring segments.

The substrate support assembly 119 includes an outer ring 1033 supporting the first cassette plate 1032.

FIG. 3 is a schematic cross-sectional side view of the processing apparatus 100 shown in FIG. 1, along Section 3-3 shown in FIG. 4, according to one implementation. The cross-sectional view shown in FIG. 3 is rotated by 55 degrees relative to the cross-sectional view shown in FIG. 1.

The processing apparatus 100 includes one or more side heat sources 118a, 118b (e.g., side lamps, side resistive heaters, side LEDs, and/or side lasers, for example) positioned outwardly of the processing volume 124. One or more second side heat sources 118b are opposite one or more first side heat sources 118a across the processing volume 124.

In FIG. 3, the flow guide structure 150 and the heat shield structure 1060 are not shown for visual clarity purposes. Additionally, the present disclosure contemplates that the flow guide structure 150 and/or the heat shield structure 1060 can be omitted from the processing apparatus 100 shown in FIGS. 1-3. In such an implementation, the one or more process gases P1 flow into an outer annulus of the processing volume 124 from the gas inject passages 182, and then flow into openings 215, 216 between and outwardly of the arcuate supports 212, and then into gaps between substrates 107. The one or more process gases P1 flow out of the gaps, into the openings 215, 216 on an exhaust side of the substrates 107, into the outer annulus of the processing volume 124, and into the one or more gas exhaust passages 172. The present disclosure also contemplates that a plurality of lines (such as conduits) in the processing volume 124 can connect each of the gas inject passages 182 to each of the inlet openings of the cassette 1030.

In addition to the one or more temperature sensors 191, 192 positioned above the processing volume 124 and above the second shield plate 1062, the processing apparatus 100 may include one or more temperature sensors 281, such as optical pyrometers, which measure temperatures within the processing apparatus 100 (such as on the surfaces of the upper window 116 and/or one or more surfaces of the substrates 107, the heat shield structure 1060, the plurality of windows 457 (discussed below), and/or the cassette 1030). The one or more temperature sensors 281 are side temperature sensors (e.g., side pyrometers) that are positioned outwardly of the processing volume 124, outwardly of the one or more second flow dividers 152 of the flow guide structure 150, outwardly of the one or more second flow dividers 152 of the flow guide structure 150, and outwardly of the plurality of windows 457. The one or more temperature sensors 281 can be radially aligned, for example, with the second flow dividers 152 or the plurality of windows 457 (as shown in FIG. 3).

The one or more side temperature sensors 281 (such as one or more pyrometers) can be used to measure temperatures within the processing volume 124 from respective sides of the processing volume 124. The side sensors 281 are arranged in a plurality of sensor levels (three sensor levels are shown in FIG. 3). In one or more embodiments, the number of sensor levels is equal to the number of heat source levels. In one or more embodiments, the number of sensor levels is equal to the number of inject levels 153. In one or more embodiments, the number of sensor levels is equal to the number of levels of the cassette 1030. Each sensor level corresponds to a respective level of the cassette 1030 such that one or more side sensors of each sensor level is configured to measure a temperature of the respective level (e.g., a temperature of the substrate and/or the substrate support of the respective level). Each side sensor 281 can be oriented horizontally or can be directed (e.g., oriented downwardly at an angle) toward the substrate 107 and arcuate support 212 of a respective level of the cassette 1030 (see for example the side sensors 281 shown in FIG. 6).

FIG. 4 is a schematic top cross-sectional view, along Section 4-4 shown in FIG. 1, of the processing apparatus 100 shown in FIGS. 1-3, according to one implementation.

The flow guide structure 150 includes one or more third flow dividers 451 oriented to intersect the one or more first flow dividers 151 and the one or more second flow dividers 152. The one or more third flow dividers 451 divide the plurality of flow sections 154 into a plurality of flow zones 454 (three flow zones 454 are shown for the injection section 401 in FIG. 4). In one or more embodiments, the flow guide structure 150 includes at least two flow zones 454 for the injection section 401. Each flow zone 454 of the plurality of flow zones 454 has an angular size A1 that is within a range of 15 degrees to 25 degrees. In one or more embodiments, the angular size A1 is 20 degrees. Other values are contemplated for the angular size A1. Each of the flow zones 454B, 454C includes a central axis that is angularly offset from Section 1-1 by an angle that is equal to the angular size A1.

Each flow section 154 of the plurality of flow sections 154 includes a plurality of inner voids 455 defined by the plurality of flow zones 454 such that the flow guide structure 150 and the heat shield structure 1060 are both free from gas lines. The processing apparatus 100 is free from gas lines inwardly of the gas channels 185 and inwardly of the gas exhaust passages 172. Injection of the one or more process gases P1 occurs outwardly of first shield plate 161 that is isothermal. The one or more process gases P1 flow from the gas channels 185, through the one or more gas openings 186, and into the flow sections 154 on an inject side of the cassette 1030. The one or more process gases flow from the flow sections 154, through the shield inlet openings 165, and into an inner space surrounded by the first shield plate 161. Within the inner space, the process gases P1 flow between the arcuate supports 212 and between the substrates 107. The one or more process gases P1 flow out of the inner space, through the first shield plate 161 on an exhaust side of the cassette 1030, and out through the flow sections 154 on the exhaust side of the cassette 1030. In the one or more liners 120, the flow guide structure 150, and the heat shield structure 1060, the one or more process gases P1 flow through openings and voids rather than gas lines (such as pipes and conduits). Injection of the one or more process gases P1 include flowing directly from the shield inlet openings 165 and into the openings between the arcuate supports 212, and directly from the openings between the arcuate supports 212 and into gaps between the substrates 107.

The present disclosure contemplates that, for each heat source level, one or more temperature sensors 281 are included on each of the inject side and the exhaust side of the cassette 1030. As an example a temperature sensor 281 can be disposed adjacent one or both of the side heat sources 118a, 118c on the inject side for each heat source level, and a temperature sensor 281 can be disposed adjacent one or both of the side heat sources 118b, 118d on the exhaust side for each heat source level.

In one or more embodiments, the heat shield structure 1060 is isothermal during processing (e.g., during heating using the heat sources) such that a first temperature gradient along a height of the first shield plate 161 is within a difference of 5% or less along the entirety of the height. The heat shield structure 1060 is isothermal such that a second temperature gradient along a width of the second shield plate 1062 is within a difference of 5% or less along the entirety of the width.

For each and every substrate 107, a distance (e.g., along the inner supply conduit system 121) from one or more injection valves 183 (supplying the one or more process gases P1 from the one or more gas sources 196) to the respective substrate 107 is substantially the same, such as within a difference of 5% or less with respect to each other.

The gas inject passages 182 of each inject level include one or more first gas channels 185A (one is shown) and one or more first gas openings 186A (two are shown) aligned with a first flow zone 454A of the plurality of flow zones 454. The gas inject passages 182 of each inject level include one or more second gas channels 185B (one is shown) and one or more second gas openings 186B aligned with a second flow zone 454B of the plurality of flow zones 454. The second flow zone 454B is on a first side of the first flow zone 454A. The gas inject passages 182 of each inject level include one or more second gas channels 185C (one is shown) and one or more third gas openings 186C aligned with a third flow zone 454C of the plurality of flow zones 454. The third flow zone 454C is on a second side of the first flow zone 454A.

The one or more third flow dividers 451 extend radially outward between the first shield plate 161 and the chamber body 130 such that plurality of flow zones 454 are pie-shaped.

Each of the gas openings 186, the divider inlet openings 155, the divider outlet openings 156, the shield inlet openings 165, and/or the shield outlet openings 166 can include holes (such as cylindrical holes) and/or arcuate slots. For each inject level, each of the gas openings 186, the divider inlet openings 155, the divider outlet openings 156, the shield inlet openings 165, and/or the shield outlet openings 166 can include a single opening or a plurality of openings. For example, the three shield outlet openings 166 shown in FIG. 4 can be combined into a single arcuate slot. As another example, there can be a plurality of injection points for each substrate 107. The present disclosure contemplates that the aspects, features, components, operations, and/or properties can be combined for the inlet openings and the outlet openings described herein.

The plurality of divider inlet openings 155 are offset from the plurality of shield inlet openings 165 in a direction D1 parallel to the one or more third flow dividers 451.

The plurality of divider inlet openings 155 include one or more divider inlet openings 155A, 155B, 155C aligned with each respective flow zone 454A, 454B, 454C of the plurality of flow zones 454. The plurality of shield inlet openings 165 include one or more shield inlet openings 165A, 165B, 165C aligned with each respective flow zone 454A, 454B, 454C of the plurality of flow zones 454. The plurality of divider outlet openings 156 include one or more divider outlet openings 156A, 156B, 156C aligned with each respective flow zone 454A, 454B, 454C of the plurality of flow zones 454. The plurality of shield outlet openings 166 include one or more shield outlet openings 166A, 166B, 166C aligned with each respective flow zone 454A, 454B, 454C of the plurality of flow zones 454.

The one or more liners 120 include a plurality of liner gaps 421. The liner gaps 421 can be formed in the one or more liners 120 and/or disposed between liners of the one or more liners 120. The flow guide structure 150 includes a plurality of flow gaps 456 between the plurality of third flow dividers 451. Each of the side heat sources 118a-118d and the windows 457 includes a central axis CA1 that is angularly offset from Section 1-1 by an angle A2. The angle A2 is within a range of 50 degrees to 60 degrees. In one or more embodiments, the angle A2 is 55 degrees. Other values are contemplated for the angle A2. In one or more embodiments, four side heat sources 118a-118d are included for each inject level 153 of the plurality of inject levels 153 such that the number of side heat source levels is equal to the number of inject levels 153 and the number of flow levels. In one or more embodiments the plurality of side heat sources 118a-118d are arranged in a plurality of heat source levels that correspond to the plurality of flow levels and the plurality of inject levels 153, and each of the plurality of heat sources 118a-118d is independently controlled to independently heat each flow level and each inject level 153. For example, a different irradiation can be directed toward each flow level and each inject level 153.

The plurality of flow gaps 456 are aligned with the plurality of liner gaps 421. The flow guide structure 150 includes a plurality of windows 457 aligned at least partially with the plurality of liner gaps 421. A plurality of side heat sources 118a-118d are configured to generate heat (e.g., light) through the plurality of windows 457 and the plurality of flow gaps 456. Using the windows 457 and the flow gaps 456, the heat (e.g., light) is directed toward the first shield plate 161 and not the flow guide structure 150 to facilitate heating the isothermal heat shield structure 1060. The plurality of windows 457 are offset from each other circumferentially along the chamber body 130. In one or more embodiments, the windows 457 are formed of quartz. In one or more embodiments, the windows 457 are substantially transparent and the heat shield structure 1060 and the flow guide structure 150 are each substantially opaque.

As shown in FIG. 1, each of the plurality of divider inlet openings 155, the plurality of divider outlet openings 156, the plurality of shield inlet openings 165, and the plurality of shield outlet openings 166 is aligned between the floor 134 of the processing volume 124 and a ceiling 137 of the processing volume 124. Injection and exhaustion of the process gases P1 and the purge gases P2 into and out of the processing volume 124 are through one or more sides 139 of the processing volume 124 (between the floor 134 and the ceiling 137).

As shown in FIG. 1, the opening 136 is positioned below the flow guide structure 150, below the heat shield structure 1060, and below the pre-heat ring 111. When the substrate support assembly 119 and the cassette 1030 are in a raised position for processing, the cassette 1030 (including the first cassette plate 1032) is positioned above the opening 136. In the raised position, a shoulder 1034 of the outer ring 1033 of the substrate support assembly 119 engages the pre-heat ring 111 to substantially isolate (e.g., seal) the bottom region 105 and the opening 136 from the one or more process gases P1 to facilitate reduced gas escaping through the opening 136, and reduced corrosion and/or contamination of chamber components and/or stored substrates. The substrate support assembly 119 and the cassette 1030 (including the first cassette plate 1032 and the outer ring 1033) facilitate a smaller travel distance (e.g., less lowering) of the cassette 1030 to transfer substrates 107 into or out of the cassette 1030. For example, the first cassette plate 1032 is movable upwardly relative to the outer ring 1033 (and the flow guide structure 150) such that the first support frame 198 can contact and lift the first cassette plate 1032 as the first support frame 198 lifts such that the lift pins 189 can lift the substrates 107 for transferring. Such movement facilitates using shorter lift pins 189 for a reduced footprint. As described above, the movement of the first support frame 198 (which can move the lift pins 189 and the first cassette plate 1032) is independent of the movement of the second support frame 199 (which can move the cassette 1030 supporting the substrates 107). In one or more embodiments, the outer ring 1033 is a complete ring that provides support to the cassette 1030 along an entirety of a circumference of the cassette 1030.

As shown in FIG. 4, the flow guide structure 150 includes an injection section 401, an exhaust section 402, a first cross-flow section 403, and a second cross-flow section 404. Each of the sections 401-404 includes the one or more first flow dividers 151 and the one or more second flow dividers 152. The first and second cross-flow sections 403, 404 each include two third flow dividers 451, and the injection and exhaust sections 401, 402 each include four third flow dividers 451. In one or more embodiments, the sections 401-404 each include the same number of inject levels. In the implementation shown in FIG. 4, the gas inject passages 182 of each inject level include one or more first gas openings 186A-186C opposite of the one or more gas exhaust passages 172, one or more second gas openings 186D circumferentially between the one or more first gas openings 186A-186C and the one or more gas exhaust passages 172, and one or more third gas openings 186E opposite of the one or more second gas openings 186D. Each of the one or more first gas openings 186A-186C, the one or more second gas openings 186D, and the one or more third gas openings 186E is aligned with a respective flow zone 454 of the plurality of flow zones 454A-454E.

The present disclosure contemplates that the sections 401-404 of the flow guide structure 150 can be coupled to each other (e.g., integrally formed for example as a ring structure) or can be decoupled from each other for independent movement.

Simultaneously with the one or more gas sources 196 supplying the one or more process gases P1 through the injection section 401, one or more gas sources 496, 498 can supply the one or more process gases P1 to the processing volume 124 through the first and second cross-flow sections 403, 404. The third flow dividers 451 of the sections 401-404 substantially isolate (e.g., seal) the flow gaps 456 from the one or more process gases P1. The third flow dividers 451 facilitate reduced interference of the process gases P1 with the heating (e.g., light) of the side heat sources 118a-118d.

Figure 5:
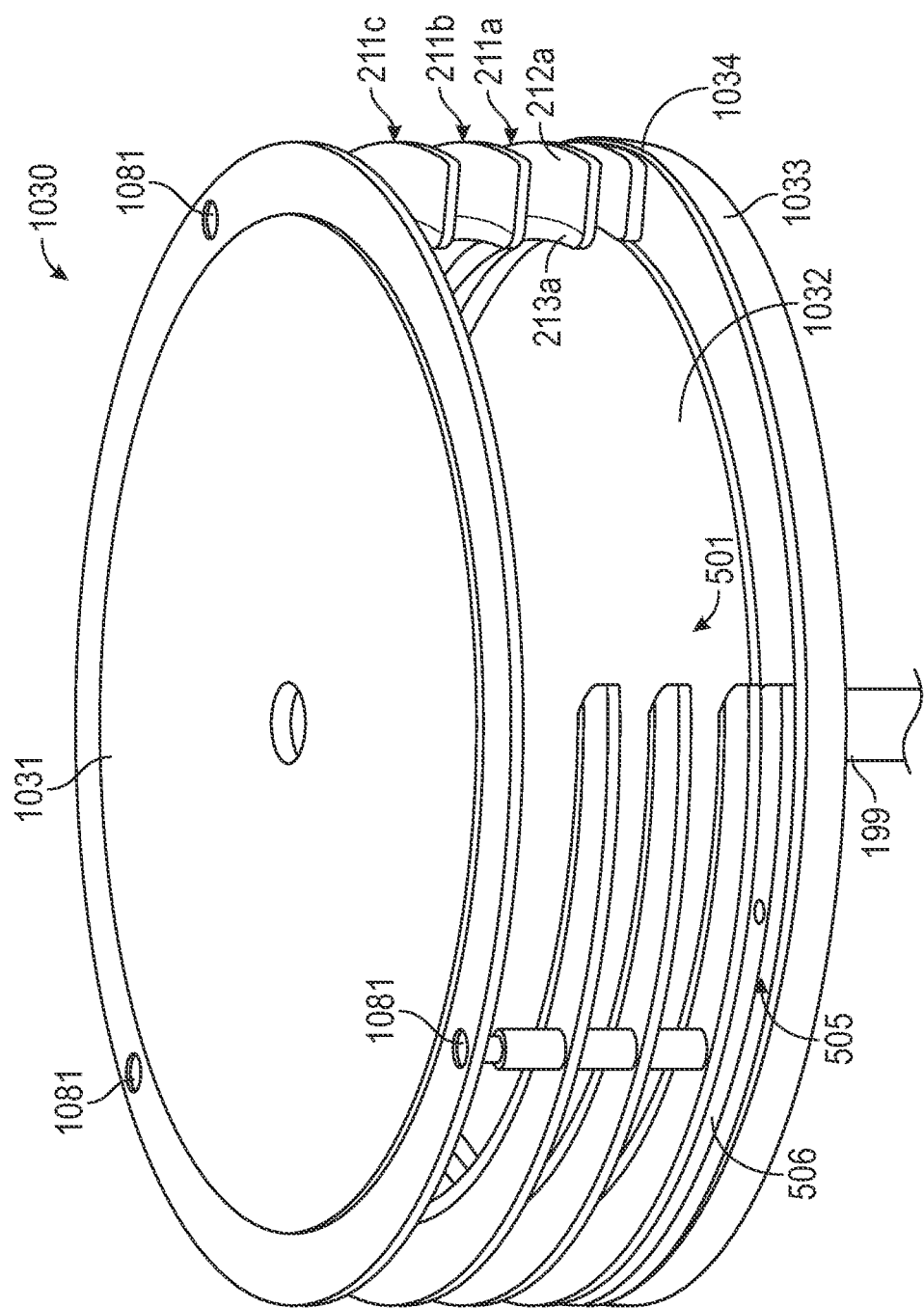
FIG. 5 is a schematic perspective view of the cassette shown in FIGS. 1-4, according to one implementation.

FIG. 5 is a schematic perspective view of the cassette 1030 shown in FIGS. 1-4, according to one implementation. In the implementation shown in FIG. 1, the cassette 1030 includes twelve levels 211 that support twelve substrates 107. In the implementation shown in FIG. 5, the cassette 1030 includes three levels 211 configured to support up to three substrates 107 during simultaneous processing. The present disclosure contemplates varying numbers of levels 211 (such as two or more) for the cassette 1030 to support varying numbers of substrates (such as two or more).

Each of the arcuate supports 212 of the levels 211 is a ring or one or more ring segments. In implementation shown in FIG. 5, each arcuate support 212 includes a gap 501 such that each arcuate support 212 is a single C-ring segment. The cassette 1030 includes a base segment 505, and arms of the second support frame 199 can be coupled to the base segment 505 through the first cassette plate 1032. The first cassette plate 1032 and the outer ring 1033 can be two pieces (as shown in FIG. 2) or can be integrated into a single piece. In one or more embodiments, the mount columns 1081 extend at least partially through the second cassette plate 1031 at a first end and extend at least partially through the base segment 505 at a second end. The mount columns 1081 can be attached to or integrally formed with the base segment 505. In one or more embodiments, the mount columns 1081 are attached to or integrally formed with an upper surface 506 of the base segment 505.

The present disclosure contemplates that the gaps 501 can face the side of the chamber body 130 that has the gas exhaust passages 172, and/or the opening 136 can be formed in the side of the chamber body 130 that has the gas exhaust passages 172.

Figure 6:
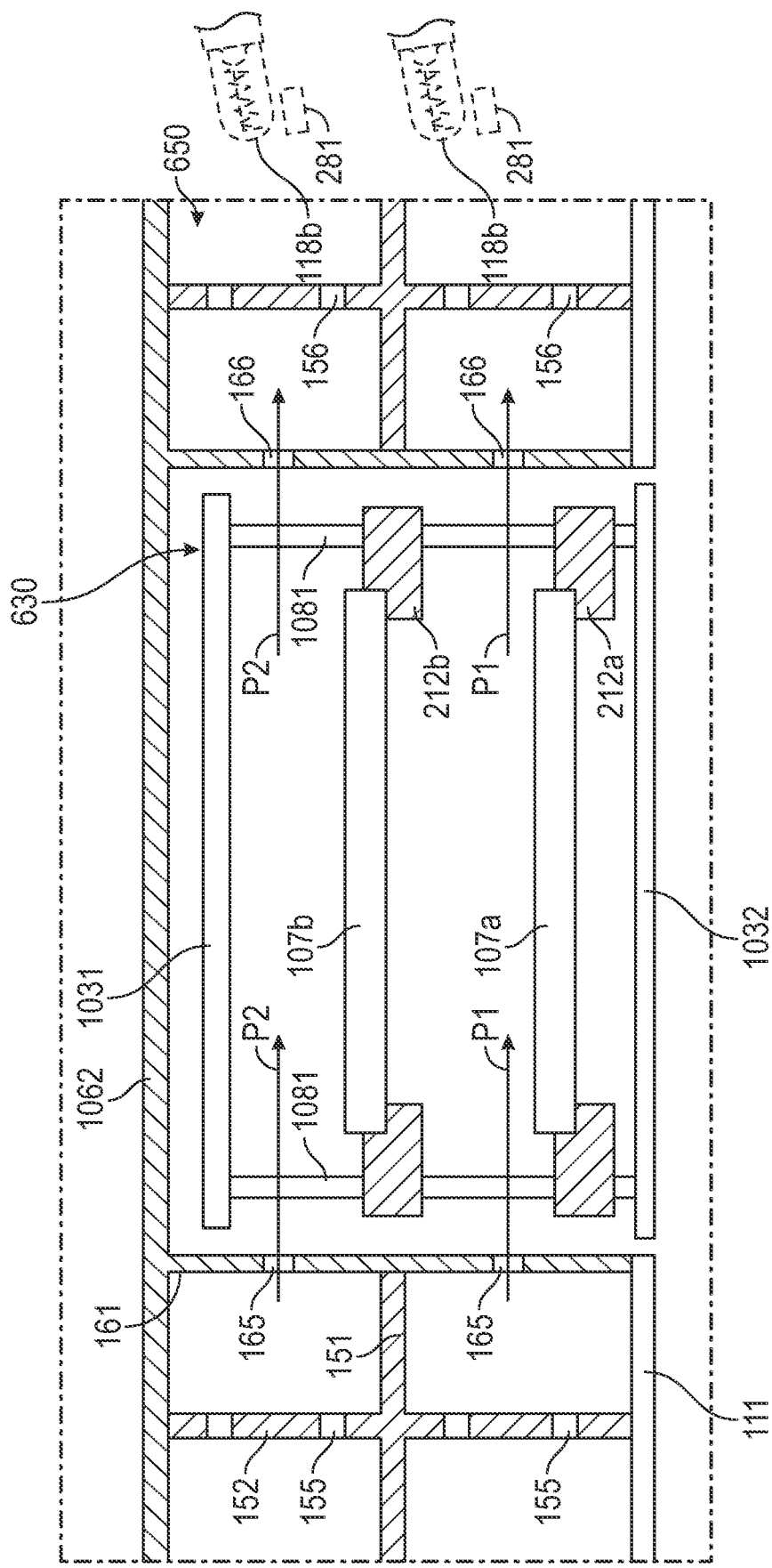
FIG. 6 is a schematic partial cross-sectional side view of a cassette and a flow guide structure, according to one implementation.

FIG. 6 is a schematic partial cross-sectional side view of a cassette 630 and a flow guide structure 650, according to one implementation. The cassette 630 has two levels that support two substrates 107a, 107b during processing. The flow guide structure 650 includes a single first flow divider 151 (in addition to the pre-heat ring 111 that can be a first flow divider). Using the first flow divider 151, the flow guide structure 650 provides two separate flows of processing gases (which can be the same or different processing gases), one flow to each of the two substrates 107a, 107b. As an example, the flow guide structure 650 can provide a first processing gas P1 to flow over a first substrate 107a, and a second processing gas P2 to flow over a second substrate 107b.

The present disclosure contemplates that the first cassette plate 1032 can be omitted such that the second cassette plate 1031 can be referred to as a cassette plate or a first cassette plate. In one or more embodiments, the first cassette plate 1032 is used when the second cassette plate 1031 is formed of an opaque material. In one or more embodiments, the first cassette plate 1032 and/or the second cassette plate 1031 is formed of a transparent material (such as transparent quartz). In one or more embodiments, the first cassette plate 1032 and/or the second cassette plate 1031 is formed of one or more of quartz, silicon carbide (SiC), or graphite coated with SiC.

In one or more embodiments, the cassettes described herein (such as the cassette 630 and/or the cassette 1030) can include a total of two levels (supporting a total of two substrates) or a total of three levels (supporting a total of three substrates), or a total of n levels (supporting a total of n substrates), where n is equal to or greater than 4) to facilitate enhanced deposition uniformity and device performance while facilitating increased throughput at low chamber dimensions and footprints.

The present disclosure contemplates that each arcuate support 212 can be replaced with a susceptor (supporting each substrate 107) that has pin openings through which the lift pins 189 can pass.

Figure 7:
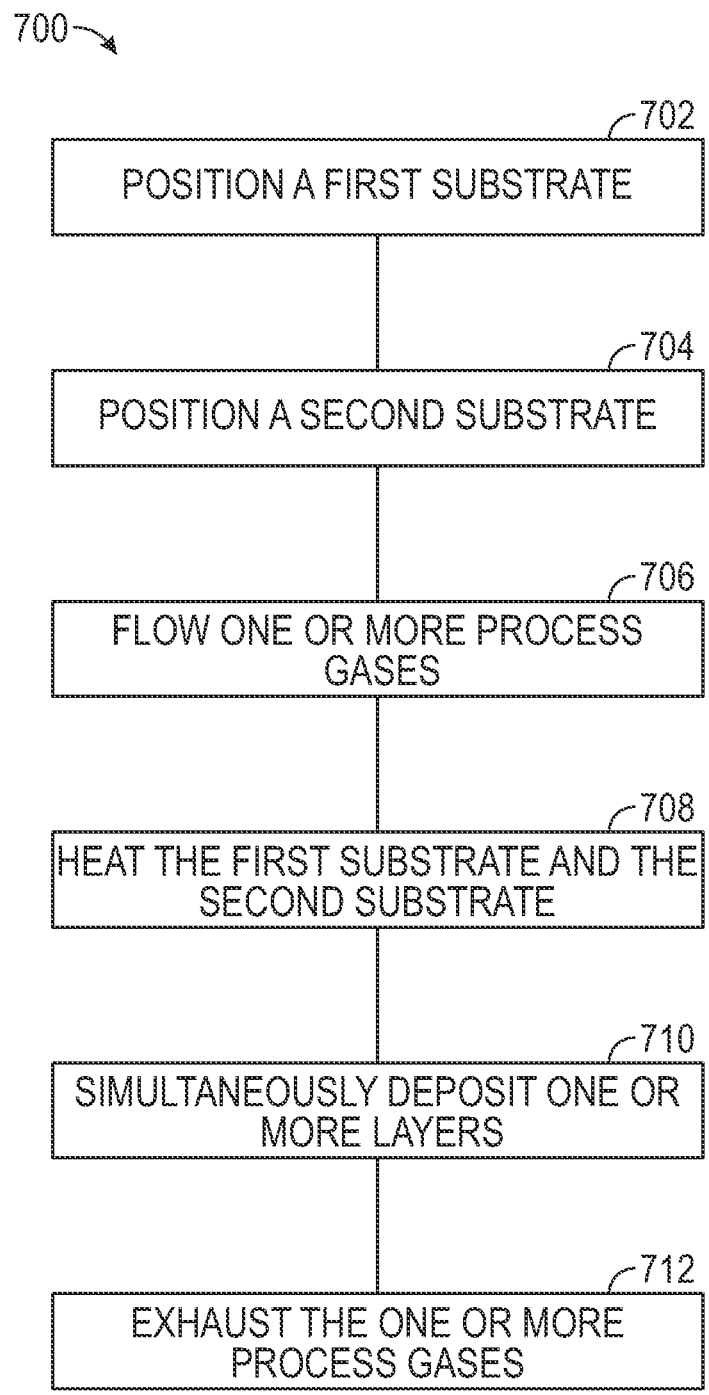
FIG. 7 is a schematic diagram view of a method of processing a plurality of substrates, according to one implementation.

FIG. 7 is a schematic diagram view of a method 700 of processing a plurality of substrates, according to one implementation.

Operation 702 of the method 700 includes positioning a first substrate in a processing volume of a chamber.

Operation 704 includes positioning a second substrate in the processing volume and at a substrate spacing from the first substrate.

The present disclosure contemplates that one or more additional substrates (in addition to the first substrate and the second substrate)—such as a third substrate and/or a fourth substrate—can be positioned in the processing volume at substrate spacing(s) from each other prior to processing and after operation 704.

Operation 706 includes flowing one or more process gases into the processing volume.

Operation 708 includes heating the first substrate and the second substrate. It is contemplated that operation 708 may occur prior to, subsequent to, or concurrent with operation 706.

Operation 710 includes simultaneously depositing one or more layers on each of the first substrate and the second substrate.

Operation 712 includes exhausting the one or more process gases from the processing volume. During the flowing of operation 706 and/or the exhausting of operation 712, the one or more process gases can follow the flow paths described herein (such as the flow paths described in relation to FIGS. 1-6).

Benefits of the present disclosure include increased throughput, efficient use of gases, reduced costs, reduced processing times, increased chamber capacity, increased growth rates of deposited films, enhanced device performance, more continuous gas velocities of gases flowing over substrates, more uniform device performance across a plurality of substrates, more uniform and stable thermal processing across a plurality of substrates, and reduced dimensions and footprint (e.g., of chambers). Benefits also include uniform adjustability, such as processing temperature control and adjustability, gas parameter control and adjustability, and substrate center-to-edge (e.g., deposition uniformity) control and adjustability. As an example, such benefits are facilitated in relatively complex operations, such as operations that call for increased center-to-edge deposition uniformity and/or batch processing a plurality of substrates at the same time.

Benefits also include enhanced device performance and modularity in application. As an example, batch processing can be used for relatively complex epitaxial deposition operations at relatively smaller footprints, relatively larger throughputs, while maintaining or enhancing growth rates and maintaining or enhancing device performance. Such benefits of the present application are facilitated by implementations of the present disclosure. Such benefits can be facilitated, for example, for inner substrates that are not the outermost substrates of a plurality of substrates supported on a cassette.

It is contemplated that aspects described herein can be combined. For example, one or more features, aspects, components, operations, and/or properties of the processing apparatus 100, the cassette 1030, the cassette 630, the flow guide structure 150, the flow guide structure 650, the heat shield structure 1060, and/or the method 700 can be combined. It is further contemplated that any combination(s) can achieve the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. An apparatus for substrate processing, comprising:
a chamber body comprising:
a processing volume,
a plurality of gas inject passages formed in the chamber body, and
one or more gas exhaust passages formed in the chamber body;
one or more heat sources configured to generate heat;
a substrate support assembly positioned in the processing volume;
a flow guide structure positioned in the processing volume, the flow guide structure comprising:
one or more first flow dividers that divide the processing volume into a plurality of flow levels,
one or more second flow dividers oriented to intersect the one or more first flow dividers and divide each flow level of the plurality of flow levels into a plurality of flow sections, and
one or more third flow dividers oriented to intersect the one or more second flow dividers and divide the plurality of flow sections into a plurality of flow zones,
wherein the plurality of gas inject passages are positioned at a plurality of inject levels, each inject level aligns with a respective flow level, the gas inject passages of each inject level are open to an outermost flow section of the respective flow level, and the gas inject passages of each inject level comprise:
one or more first gas openings aligned with a first flow zone of the plurality of flow zones,
one or more second gas openings aligned with a second flow zone of the plurality of flow zones, wherein the second flow zone is on a first side of the first flow zone, and
one or more third gas openings aligned with a third flow zone of the plurality of flow zones, wherein the third flow zone is on a second side of the first flow zone.

2. The apparatus of claim 1, wherein each flow zone of the plurality of flow zones has an angular size that is within a range of 15 degrees to 25 degrees.

3. The apparatus of claim 1, wherein each flow section of the plurality of flow sections comprises a plurality of inner voids defined by the plurality of flow zones.

4. The apparatus of claim 1, further comprising one or more liners configured to line one or more sidewalls of the chamber body, wherein the one or more first flow dividers are coupled to the one or more liners.

5. The apparatus of claim 4, further comprising a heat shield structure positioned in the processing volume, the heat shield structure comprising:
a first shield plate positioned inwardly of the one or more second flow dividers; and
a second shield plate oriented to intersect the first shield plate and supported at least partially by the one or more liners.

6. The apparatus of claim 5, wherein the substrate support assembly comprises a cassette, and the apparatus further comprises:
one or more upper pyrometers positioned above the second shield plate of the heat shield structure and oriented toward a top of the cassette;
one or more side pyrometers positioned outwardly of the one or more second flow dividers of the flow guide structure, the one or more side pyrometers oriented toward the first shield plate; and one or more pyrometers positioned below the processing volume and oriented toward a bottom of the cassette.

7. The apparatus of claim 5, wherein each of the one or more first flow dividers, the one or more second flow dividers, the one or more third flow dividers, the first shield plate, and the second shield plate is formed of one or more of quartz, silicon carbide (SiC), or graphite coated with SiC.

8. The apparatus of claim 5, wherein the one or more third flow dividers extend radially outward between the first shield plate and the chamber body such that the plurality of flow zones are pie-shaped.

9. The apparatus of claim 5, wherein:
the one or more second flow dividers comprises a plurality of divider inlet openings and a plurality of divider outlet openings formed therein; and
the first shield plate comprises a plurality of shield inlet openings and a plurality of shield outlet openings formed therein.

10. The apparatus of claim 9, wherein the plurality of divider inlet openings are offset from the plurality of shield inlet openings in a direction parallel to the one or more third flow dividers.

11. The apparatus of claim 9, wherein:
the plurality of divider inlet openings comprise one or more divider inlet openings aligned with each respective flow zone of the plurality of flow zones;
the plurality of divider outlet openings comprise one or more divider outlet openings aligned with each respective flow zone of the plurality of flow zones;
the plurality of shield inlet openings comprise one or more shield inlet openings aligned with each respective flow zone of the plurality of flow zones; and
the plurality of shield outlet openings comprise one or more shield outlet openings aligned with each respective flow zone of the plurality of flow zones.

12. The apparatus of claim 9, wherein each of the plurality of divider inlet openings, the plurality of divider outlet openings, the plurality of shield inlet openings, and the plurality of shield outlet openings is aligned between a floor of the processing volume and a ceiling of the processing volume.

13. The apparatus of claim 1, further comprising a substrate transfer opening formed in the chamber body and positioned below the flow guide structure, wherein the substrate support assembly comprises an outer ring supporting a plate, and the plate is movable relative to the outer ring.

14. An apparatus for substrate processing, comprising:
a chamber body comprising:
one or more sidewalls,
a processing volume,
a plurality of gas inject passages formed in the chamber body, and
one or more gas exhaust passages formed in the chamber body;
a substrate support assembly positioned in the processing volume;
one or more liners configured to line the one or more sidewalls of the chamber body, the one or more liners comprising a plurality of liner gaps;
a flow guide structure positioned in the processing volume, the flow guide structure comprising:
one or more first flow dividers that divide the processing volume into a plurality of flow levels, the one or more first flow dividers coupled to the one or more liners,
one or more second flow dividers oriented to intersect the one or more first flow dividers and divide each flow level of the plurality of flow levels into a plurality of flow sections, and
a plurality of third flow dividers oriented to intersect the one or more second flow dividers and divide the plurality of flow sections into a plurality of flow zones, and
a plurality of flow gaps between the plurality of third flow dividers, the plurality of flow gaps aligned with the plurality of liner gaps; and
a plurality of windows aligned at least partially with the plurality of liner gaps.

15. The apparatus of claim 14, further comprising:
a plurality of side heat sources configured to generate heat through the plurality of windows and the plurality of flow gaps, wherein the plurality of side heat sources are arranged in a plurality of heat source levels that correspond to the plurality of flow levels, and each of the plurality of heat source levels is independently controlled to independently heat each flow level of the plurality of flow levels;
one or more upper heat sources configured to generate heat through a ceiling of the processing volume;
one or more lower heat sources configured to generate heat through a floor of the processing volume; and
one or more side pyrometers positioned outwardly of the one or more second flow dividers of the flow guide structure, each of the one or more side pyrometers radially aligned with one of the plurality of windows and one of the plurality of liner gaps.

16. The apparatus of claim 14, wherein the plurality of windows are offset from each other circumferentially along the chamber body, and the plurality of windows are formed of quartz.

17. The apparatus of claim 14, wherein the gas inject passages of each inject level comprise:
one or more first gas openings opposite of the one or more gas exhaust passages;
one or more second gas openings circumferentially between the one or more first gas openings and the one or more gas exhaust passages; and
one or more third gas openings opposite of the one or more second gas openings,
wherein each of the one or more first gas openings, the one or more second gas openings, and the one or more third gas openings is aligned with a respective flow zone of the plurality of flow zones.

18. An apparatus for substrate processing, comprising:
a chamber body comprising:
a processing volume,
a plurality of gas inject passages formed in the chamber body, and
one or more gas exhaust passages formed in the chamber body;
one or more heat sources configured to generate heat;
a substrate support assembly positioned in the processing volume and comprising a cassette;
a flow guide structure positioned in the processing volume, the flow guide structure comprising:
one or more first flow dividers that divide the processing volume into a plurality of flow levels,
one or more second flow dividers oriented to intersect the one or more first flow dividers and divide each flow level of the plurality of flow levels into a plurality of flow sections, and one or more third flow dividers oriented to intersect the one or more second flow dividers and divide the plurality of flow sections into a plurality of flow zones;
one or more liners configured to line one or more sidewalls of the chamber body, the one or more first flow dividers are coupled to the one or more liners;
a heat shield structure positioned in the processing volume, the heat shield structure comprising:
a first shield plate positioned inwardly of the one or more second flow dividers, and
a second shield plate oriented to intersect the first shield plate and supported at least partially by the one or more liners;
one or more upper pyrometers positioned above the second shield plate of the heat shield structure and oriented toward a top of the cassette;
one or more side pyrometers positioned outwardly of the one or more second flow dividers of the flow guide structure, the one or more side pyrometers oriented toward the first shield plate; and
one or more pyrometers positioned below the processing volume and oriented toward a bottom of the cassette.

19. An apparatus for substrate processing, comprising:
a chamber body comprising:
a processing volume,
a plurality of gas inject passages formed in the chamber body, and
one or more gas exhaust passages formed in the chamber body;
one or more heat sources configured to generate heat;
a substrate support assembly positioned in the processing volume;
a flow guide structure positioned in the processing volume, the flow guide structure comprising:
one or more first flow dividers that divide the processing volume into a plurality of flow levels,
one or more second flow dividers oriented to intersect the one or more first flow dividers and divide each flow level of the plurality of flow levels into a plurality of flow sections, and
one or more third flow dividers oriented to intersect the one or more second flow dividers and divide the plurality of flow sections into a plurality of flow zones; and
a first shield plate positioned inwardly of the one or more second flow dividers, the one or more third flow dividers extending radially outward between the first shield plate and the chamber body such that the plurality of flow zones are pie-shaped.

20. The apparatus of claim 19, further comprising:
one or more liners configured to line one or more sidewalls of the chamber body, wherein the one or more first flow dividers are coupled to the one or more liners; and
a second shield plate oriented to intersect the first shield plate and supported at least partially by the one or more liners.

21. An apparatus for substrate processing, comprising:
a chamber body comprising:
a processing volume,
a plurality of gas inject passages formed in the chamber body, and
one or more gas exhaust passages formed in the chamber body;
one or more heat sources configured to generate heat;
a substrate support assembly positioned in the processing volume;
a flow guide structure positioned in the processing volume, the flow guide structure comprising:
one or more first flow dividers that divide the processing volume into a plurality of flow levels,
one or more second flow dividers oriented to intersect the one or more first flow dividers and divide each flow level of the plurality of flow levels into a plurality of flow sections, the one or more second flow dividers comprising a plurality of divider inlet openings and a plurality of divider outlet openings formed therein, and
one or more third flow dividers oriented to intersect the one or more second flow dividers and divide the plurality of flow sections into a plurality of flow zones; and
a first shield plate positioned inwardly of the one or more second flow dividers, the first shield plate comprising a plurality of shield inlet openings and a plurality of shield outlet openings formed therein.

22. The apparatus of claim 21, further comprising:
one or more liners configured to line one or more sidewalls of the chamber body, wherein the one or more first flow dividers are coupled to the one or more liners; and
a second shield plate oriented to intersect the first shield plate and supported at least partially by the one or more liners.

* * * * *